US008884506B2

(12) United States Patent
Jeong

(10) Patent No.: US 8,884,506 B2
(45) Date of Patent: Nov. 11, 2014

(54) LIGHT EMITTING DEVICE CAPABLE OF PREVENTING BREAKAGE DURING HIGH DRIVE VOLTAGE AND LIGHT EMITTING DEVICE PACKAGE INCLUDING THE SAME

(75) Inventor: Hwan Hee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 339 days.

(21) Appl. No.: 13/402,619

(22) Filed: Feb. 22, 2012

(65) Prior Publication Data

US 2012/0182738 A1 Jul. 19, 2012

(30) Foreign Application Priority Data

Sep. 1, 2011 (KR) .................. 10-2011-0088636

(51) Int. Cl.
*F21V 21/00* (2006.01)
*H01L 33/60* (2010.01)
*H01L 27/15* (2006.01)
*H01L 33/62* (2010.01)

(52) U.S. Cl.
CPC ..... *H01L 27/156* (2013.01); *H01L 2224/48091* (2013.01); *H01L 33/62* (2013.01)
USPC .................... 313/498; 362/249.02; 313/503

(58) Field of Classification Search
CPC ................ H01L 27/153; H01L 2224/48137; H01L 33/38; H01L 33/62; H01L 33/642; F21K 9/00
USPC ........................................... 313/498
See application file for complete search history.

(56) References Cited

U.S. PATENT DOCUMENTS

| 8,227,272 B2* | 7/2012 | Lee et al. ............... 438/28 |
| 2009/0278159 A1 | 11/2009 | Wang et al. |
| 2010/0224904 A1* | 9/2010 | Lee et al. ............... 257/99 |
| 2010/0230705 A1* | 9/2010 | Jeong ...................... 257/98 |
| 2011/0024781 A1* | 2/2011 | Fujimoto et al. ......... 257/98 |

FOREIGN PATENT DOCUMENTS

| DE | 102008011848 A1 | 9/2009 |
| WO | WO 2007/001124 A1 | 1/2007 |

* cited by examiner

*Primary Examiner* — Tracie Y Green
(74) *Attorney, Agent, or Firm* — Birch, Stewart, Kolasch & Birch, LLP

(57) ABSTRACT

A light emitting device includes a light emitting structure divided into a plurality of light emitting cells and a boundary region, the light emitting cells including a first conductive type semiconductor layer, an active layer and a second conductive type semiconductor layer, respectively; a first electrode disposed on each of the light emitting cells; first conductive layers disposed under the light emitting cells; at least one second conductive layer disposed under the first conductive layers; a first insulation layer disposed between each of the first conductive layers, and between the first conductive layers and the at least one second conductive layer; and a connecting electrode connecting the first electrode on one light emitting cell with the at least one second conductive layer under another light emitting cell. The at least one second conductive layer is connected with one of the first conductive layers through the first insulation layer.

20 Claims, 8 Drawing Sheets

LIGHT EMITTING DEVICE CAPABLE OF PREVENTING BREAKAGE DURING HIGH DRIVE VOLTAGE AND LIGHT EMITTING DEVICE PACKAGE INCLUDING THE SAME

CROSS-REFERENCE TO RELATED APPLICATION

This application claims priority under 35 U.S.C. §119 from Korean Application No. 10-2011-0088636 filed in Korea on Sep. 1, 2011, the subject matter of which is hereby incorporated in its entirety by reference as if fully set forth herein.

TECHNICAL FILED

Embodiments may relate to a light emitting device, a light emitting device package, a lighting device and a display device.

BACKGROUND

Red, green and blue light emitting diodes (LED) capable of presenting high luminescence and a white light have been developing based on development of organic chemical vapor deposition and molecular beam growth of gallium nitride (GaN).

Such a light emitting diode (LED) may have advantages of good eco-friendliness because of no harmful material to the environment such as mercury (Hg), a long life span of usage and low power consumption. As a result, the light emitting diodes (LED) have been substituting for conventional light sources. Core competitive factors of such the LED may be realization of high luminescence enabled by high efficient and high output chip and packaging technology.

It is important to enhance light extraction efficiency in order to realize the high luminescence. To enhance the light extraction efficiency have been studied and developed various manners that use flip-chip, surface texturing, patterned sapphire substrate (PSS), photonic crystal technology and an anti-reflection layer structure.

SUMMARY

Accordingly, the embodiments may provide a light emitting device capable of preventing breakage thereof which might be generated by a high driving voltage.

In one embodiment, a light emitting device includes a light emitting structure divided into a plurality of light emitting cells and a boundary region, the plurality of the light emitting cells comprising a first conductive type semiconductor layer, an active layer and a second conductive type semiconductor layer, respectively; a first electrode disposed on each of the light emitting cells; a second electrode disposed under each of the light emitting cells; a first conductive layers disposed under the light emitting cells; at least one second conductive layer disposed under the first conductive layers; a first insulation layer disposed between each of the first conductive layers, and between the first conductive layers and the at least one second conductive layer; and a connecting electrode configured to connect the first electrode on one light emitting cell with the at least one second conductive layer under second light emitting cell. The light emitting cells may be connected with each other in serial by the connection between the second conductive layers and the connecting electrode.

The at least one second conductive layer may be spaced apart a predetermined distance from each other, corresponding to the other ones except one of the light emitting cells.

The first conductive layer may include a reflection layer disposed under the second conductive type semiconductor layer; and a first barrier layer disposed under the reflection layer.

The light emitting device may further include a second barrier layer disposed under the second conductive layers, with being electrically connected with one of the first conductive layers; and a second insulation layer between one of the second conductive layers, and between the second barrier layer and the second conductive layers.

The connecting electrode may connect a first electrode of neighboring two light emitting cells with a second conductive layer corresponding to the other one of the neighboring two light emitting cells.

The light emitting device may further include a passivation layer disposed between each of the light emitting cells and the connecting electrode; and a protection layer disposed on the boundary region.

The connecting electrode may be disposed on the passivation layer, passing through the protection layer and the first insulation layer.

At least predetermined region of each second conductive layer may be in contact with the corresponding first conductive layer, through the first insulation layer.

A predetermined region of the second conductive layers may be overlapped with a neighboring region of the boundary region adjacent thereto along a vertical direction. At least predetermined region of the second conductive layer disposed corresponding to one of the other light emitting cells may be overlapped with another light emitting cell adjacent to the one of the other light emitting cells along a vertical direction.

Each of the conductive layers may include a base plate formed in a plate shape, with the connecting electrode connected thereto; and a through portion protruded from the base plate, with being connected with the corresponding first conductive layer through the first insulation layer. For example, the through portion may be connected to the barrier layer of the corresponding first conductive layer.

The through portion may be formed of the same material used for the base plate and it may be integrally formed with the base plate. The through portion may be in contact with a lateral surface of the base plate. The through portion may be formed of the same material as the material used for the base plate. The length possessed by a side of the through portion may be the same as the length possessed by a side of the base plate. Roughness may be formed in at least one of top and lower surfaces of the base plate. The second conductive layers may be formed of a reflective material. The light emitting device may further include a support layer disposed under the second barrier layer.

According to the embodiment, the concentrated electric field may be dispersed and breakage of the light emitting device may be prevented accordingly.

BRIEF DESCRIPTION OF THE DRAWINGS

Arrangements and embodiments may be described in detail with reference to the following drawings in which like reference numerals refer to like elements and wherein.

DETAILED DESCRIPTION

It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

The size of each element is exaggerative, omitted or illustrative schematically. Also, the size of each element may not reflect the substantial size necessarily. The same reference numbers will be used throughout the drawings to refer to the same or like parts. Hereinafter, embodiments will be described with reference to the annexed drawings. Hereinafter, embodiments will be described with reference to the annexed drawings.

Figure 1:
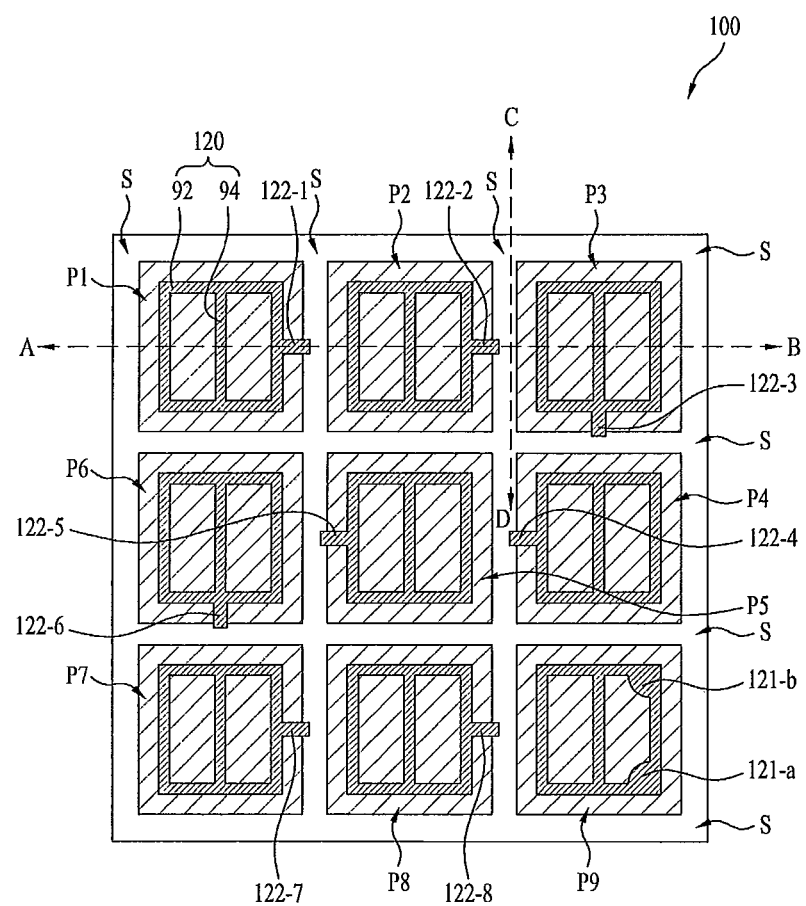
FIG. 1 is a plane view illustrating a light emitting device according to a first embodiment.
Figure 2:
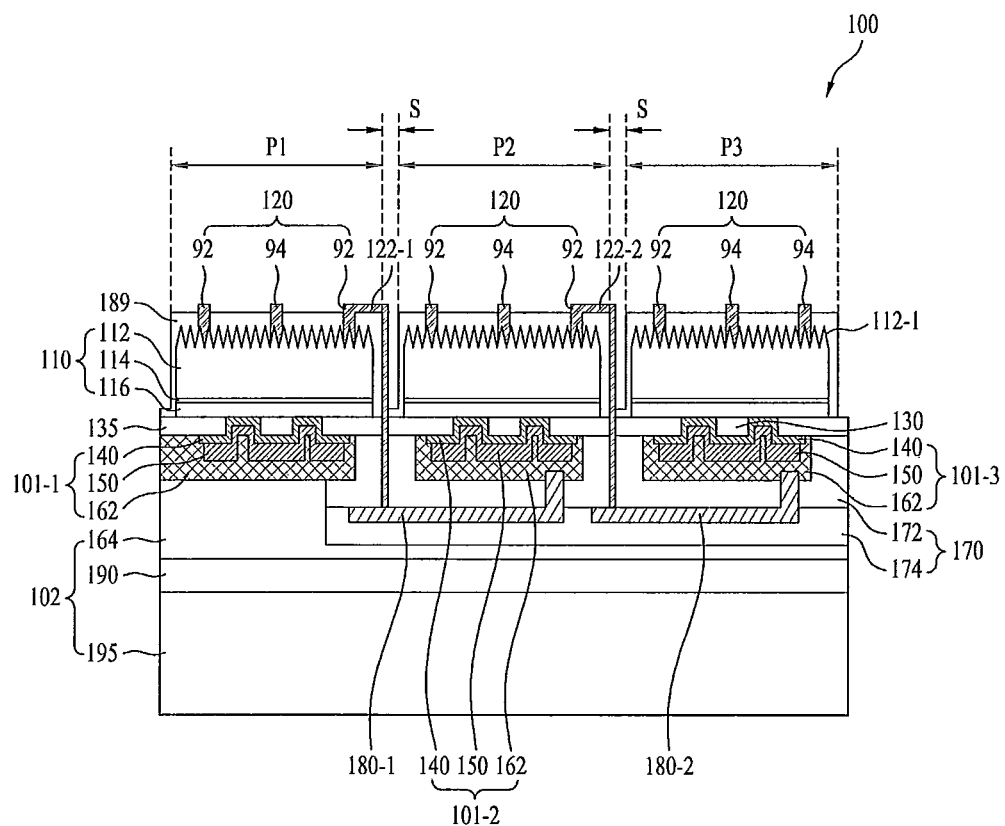
FIG. 2 is a sectional view illustrating the light emitting device shown in FIG. 1, along AB direction.

FIG. 1 a plane view illustrating a light emitting device 100 according to a first embodiment. FIG. 2 is a sectional view illustrating the light emitting device 100 shown in FIG. 1, along AB direction.

In reference to FIGS. 1 and 2, the light emitting device 100 may include a light emitting structure 110 which is divided into a plurality of light emitting cells (P1 to Pn, n>1 and is a natural number), a first electrode 120, a current blocking layer 130, a protection layer 135, an ohmic layer 140, first metal layers 101-1 to 101-$n$ (n>1 and 'n' is a natural number) including a reflective layer 150 and a barrier layer 162, an insulation layer 170 having a first insulation layer 172 and a second insulation layer 174, second metal plates 180-1 to 180-$j$ (j≥1 and 'j' is a natural number), a second barrier layer 164, a bolding layer 190, a second metal layer 102 having a supporter 195, a passivation layer 189 and connecting electrodes 122-1 to 122-$m$ (m>1 and 'm' is a natural number).

The light emitting structure 110 may generate light and it may have a plurality of III-V compound semiconductor layers. As shown in FIG. 2, the light emitting structure 110 may have the structure configured of a second conductive type semiconductor layer 116, an active layer 114 and a first conductive type semiconductor layer 112 which are multilayered sequentially. In other words, the second conductive type semiconductor layer 116 may be located under the first conductive type semiconductor 112 and the active layer 114 may be located between the first conductive type semiconductor layer 112 and the second conductive type semiconductor.

The second conductive type semiconductor layer 116 may be a III-V compound semiconductor having a second conductive type dopant doped therein. The second conductive type semiconductor 116 may be formed of a semiconductor material having an empirical formula: $In_xAl_yGa_{1-x-y}N$, (0≤x≤1, 0≤y≤1, 0≤x+y≤), for example, a selected one from GaN, AlN, AlGaN, InGaN, InN, InAlGaN, AlInN, AlGaAs, GaP, GaAs, GaAsP and AlGaInP, having p-dopant such as Mg, Zn, Ca, Sr or Ba doped thereon.

The active layer 114 may generate light by using the energy generated during the recombination between an electron and a hole which are provided by the first conductive type semiconductor layer 112 and the second conductive type semiconductor layer 116, respectively. The active layer 114 may have a single quantum well structure, a multi-quantum well structure (MQW), a quantum dot structure or a quantum wire structure.

For example, in case of the quantum well structure, the active layer 114 may have the single or multi quantum well structure including a well layer having an empirical formula: $In_xAl_yGa_{1-x-y}N$ (0≤x≤1, 0≤y≤1, 0≤x+y≤) and a barrier layer having an empirical formula: InaAlbGa1−a−b (0≤a≤1, 0≤b≤1, 0≤a+b≤). The well layer may be formed of a material having a small energy gap than an energy gap of the barrier layer.

The first conductive type semiconductor layer 112 may be a III-V compound semiconductor having a first conductive type dopant doped thereon. The second conductive type semiconductor 112 may be formed of a semiconductor material having an empirical formula: $In_xAl_yGa_{1-x-y}N$ (0≤x≤1, 0≤y≤1, 0≤x+y≤), for example, a selected one from GaN, AlN, AlGaN, InGaN, InN, InAlGaN, AlInN, AlGaAs, GaP, GaAs, GaAsP and AlGaInP, having n-dopant such as Si, Ge, Sn, Se, or Te doped thereon.

A conductive type clad layer may be disposed between the active layer 114 and the first conductive type semiconductor layer 112 or between the active layer 114 and the second conductive type semiconductor layer 116. The conductive type clad layer may be formed of nitride semiconductor (AlGaN, for example).

The light emitting structure 110 may further include a third conductive type semiconductor layer (not shown) disposed under the second conductive type semiconductor layer 116. The third conductive type semiconductor layer may have an opposite polarity to a polarity of the second conductive type semiconductor layer 116. The first conductive type semiconductor layer 112 may be an n-type semiconductor layer and the second conductive type semiconductor layer 116 may be a p-type semiconductor layer. Because of that, the light emitting device 110 may have at least one of n-p, p-n, n-p-n and p-n-p junctions.

The light emitting structure 110 may have the plurality of the light emitting cells P1 to Pn (n>1 and 'n' is a natural number) and a boundary region (S). The boundary region (S) may be a region located between each two of the light emitting cells P1 to Pn (n>1 and 'n' is a natural number) or it may be a region located around each of the light emitting cells P1 to Pn (n>1 and 'n' is a natural number). The single chip light emitting structure 110 may be divided into the plurality of the light emitting cells P1 to Pn (n>1 and 'n' is a natural number) by the boundary region (S).

The protection layer 135 may be disposed on the boundary region (S) and the plurality of the light emitting cells P1 to Pn (n>1 and 'n' is a natural number) may be defined by the protection layer 135. The protection layer 135 may protect the light emitting cells P1 to Pn (n>1 and 'n' is a natural number) from being etched by the isolation-etching that is performed to divide the light emitting structure 110 into the plurality of the light emitting cells P1 to Pn (n>1 and 'n' is a natural number). The protection layer 135 can reduce the reliability degrading of the light emitting device 100. The protection layer 135 may be formed of the material used to form the current blocking layer 130.

For example, the light emitting structure 110 shown in FIG. 1 may be divided into nine light emitting cells P1 to Pn (n=9, for example) and the boundary region (S) located each two of the light emitting cells P1 to Pn (n=9, for example) and around each of the light emitting cells P1 to Pn (n=9, for example).

Each of the light emitting cells P1 to Pn (n=9, for example) may be configured of the second conductive type semiconductor layer 116, the active layer and the first conductive type semiconductor layer 113 which are multi-layered along a vertical direction. Here, the vertical direction may be from the second conductive type semiconductor layer 116 toward the first conductive type semiconductor layer 112 or it may be vertical to the support layer 195.

The first electrode 120 may be disposed on the light emitting cells P1 to Pn (n=9, for example). In other words, the first electrode 120 may be disposed on the first conductive type semiconductor layer 112 of each light emitting cell P1 to Pn (n=9, for example) the first electrode 120 may have a predetermined pattern and the embodiment is not limited to the pattern shown in FIG. 1. The predetermined pattern may be variable.

Roughness 112-1 may be formed on a top surface of the first conductive type semiconductor layer 112 to enhance light extraction efficiency. Also, roughness (not shown) may be formed on a surface of the first electrode 120 to enhance the light extraction efficiency.

For example, the first electrode 120 may include an outer electrode 92 disposed along an edge region of the top surface of the first conductive type semiconductor layer 112 provided in each of the light emitting cells P1 to Pn (n=9, for example) and an inner electrode 94 disposed in the outer electrode 92.

The current blocking layer 130 may be disposed under the second conductive type semiconductor layer 116 and it may be in contact with a lower surface of the second conductive type semiconductor layer 116.

For example, the current blocking layer 130 may be disposed on a predetermined region of the lower surface of the second conductive type semiconductor layer provided in each of the light emitting cells P1 to Pn (n=9, for example). The current blocking layer 130 may reduce current crowding only at a region of each light emitting cell P1 to Pn (n=9, for example), to enhance luminous efficiency.

The current blocking layer 130 may be disposed, corresponding to the first electrode 120, and it may have at least predetermined region overlapped with the first electrode 120 along a vertical direction. The current blocking layer 130 may have a pattern corresponding to the pattern of the first electrode 120. Here, the vertical direction may be from the second conductive type semiconductor layer 112 toward the first conductive type semiconductor layer 116.

The current blocking layer 130 may be formed of a material having low electro-conductivity, a material forming Schottky-contact with the second conductive type semiconductor layer 116 or an electric insulation material. For example, the current blocking layer 130 may includes at least one of ZnO, SiO$_2$, SiON, Si$_3$N$_4$, Al$_2$O$_3$, TiO$_2$, Al or Cr.

The first conductive layers 101-1 to 101-n (n=9, for example) may be disposed under a corresponding one of the second conductive type semiconductor layers 116 provided in the plurality of the light emitting cells P1 to Pn (n=9, for example) and the first conductive layers 101-1 to 101-n (n=9, for example) may be spaced apart a predetermined distance from each other. Each of them may include an ohmic layer 140, a reflection layer 150 and a first barrier layer 162.

The ohmic layer 140 may be disposed under the plurality of the light emitting cells P1 to Pn (n=9, for example) and it may ohmic-contact with the second conductive type semiconductor layer 116. The ohmic layer 140 may be employed to enable the electric power supplied to the light emitting structure 110 by the second electrode 101 smoothly. For example, the ohmic layer 140 may include at least one of In, Zn, Ag, Sn, Ni and Pt. The ohmic layer 140 may cover lateral and lower surfaces of the current blocking layer 130.

The reflection layer 150 may be disposed under the ohmic layer provided in each of the light emitting cells P1 to Pn (n=9, for example) and it may reflect the light incident thereon from the light emitting structure 110, to enhance the light extraction efficiency of the light emitting device 100. The reflection layer 150 may cover an edge region of the ohmic layer 140, in contact with an outermost lateral surface of the ohmic layer 140.

The reflection layer 150 may be formed of a metal material including at least one of Ag, Ni, Al, Pd, Ir, Ru, Mg, Zn, Pt, Au and Hf and an alloy of them. Also, the reflection layer 150 may be formed in a multi-layer structure which uses the metal material or the alloy of the metal materials mentioned above and a light-transmitting conductive material such as indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO) and antimony tin oxide (ATO). For example, the reflection layer 150 may be formed of IZO/Ni, AZO/Ag, IZO/Ag/Ni or AZO/Ag/Ni.

According to another embodiment, the ohmic layer 140 may not be provided independently and the material used for the reflection layer 150 may be selected from materials capable of ohmic-contacting with the second conductive type semiconductor layer 116, such that the reflection layer 150 may in ohmic-contact with the second conductive type semiconductor layer 116.

The first barrier layer 162 may be disposed under the reflection layer 150 corresponding to the light emitting cells P1 to Pn (n=9, for example), to prevent a metal ion of the support layer 195 from being transmitted or diffused to the reflection layer 150 and the ohmic layer 140. The first barrier layer 162 may include a barrier metal material, for example, at least one of Pt, Ti, W, V, Fe and Mo, and it may be a single layer or a multilayer.

The second conductive layers 180-1 to 180-j (j≥1 and 'j' is a natural number) may be disposed under the first conductive layers 101-1 to 101-n (n=9, for example), spaced apart a predetermined distance from each other. The second conductive layers 180-1 to 180-j (j≥1 and 'j' is a natural number) may be formed of a conductive material, for example, at least one of Ti, Ni, Cu, Au, Pt and W or an alloy of them.

In addition, the second conductive layers 180-1 to 180-j (j≥1 and 'j' is a natural number) may be formed of a reflective as well as conductive material. For example, the second conductive materials 180-1 to 180-j (j≥1 and 'j' is a natural number) may be formed of the same material used for the reflection layer 150. The second conductive layers 180-1 to 180-j (j≥1 and 'j' is a natural number) may reflect the light incident thereon from the light emitting cells P1 to Pn (n=9, for example).

The second conductive layers 180-1 to 180-j (j≥1 and 'j' is a natural number) may be disposed, corresponding to the others light emitting cells P2 to Pn (n=9, for example), respectively, except one of them.

For example, each of the second conductive layers 180-1 to 180-j (j=8, for example) may be disposed, corresponding to each of the other first conductive layers 101-1 to 101-n (n=9, for example) except one of them and each of the second conductive layers 180-1 to 180-j (j=8, for example) may be electrically connected with the corresponding one.

The second conductive layers 180-1 to 180-j (j=8, for example) may be disposed, corresponding to the first conductive layers 101-2 to 101-n (n=9, for example) located under the other light emitting cells P2 to Pn (n=9, for example) except a first light emitting cell P1, respectively.

For example, the second-conductive layer 180-1 may be corresponding to a first conductive layer 101-2 of a second light emitting cell P2 and it may be electrically connected with the first conductive layer 101-2 of the second light emitting cell P2.

The first insulation layer 172 may cover an edge region of the first conductive layer 101-1 to 101-n (n=9, for example). The first insulation layer 172 may be disposed between each two of the first conductive layers 101-1 to 101-n (n=9, for example) and between the first conductive layer 101-1 to 101-n (n=9, for example) and the second conductive layers 180-1 to 180-j (j=8, for example).

The first insulation layer 172 may electrically insulate the first conductive layers 101-1 to 101-n (n=9, for example) from each other and it may electrically insulate the second conductive layers 180-1 to 180-j (j=8, for example) from each other.

The second barrier layer 164 may be disposed under the first insulation layer 172 and it may be electrically connected with the first conductive layer (for example, 101-1) located under one of the light emitting cells P1 to Pn (n=9, for example).

For example, the second barrier layer 164 may be located under the second insulation layer 174, in electrical contact with the first conductive layer 101-1 located under the first light emitting cell P1.

A second electric power (a positive electric power (+), for example) may be supplied to the first conductive layer (101-1, for example) of the first light emitting cell P1 through the second barrier layer 164 bonded with the support layer 195 which will be described layer in detail.

The second barrier layer 164 may be formed of the same material used for the first barrier material 162 and it may be a single layer or multilayer.

The second insulation layer 174 may be disposed between the second conductive layers 180-1 to 180-j (j=8, for example) and between the second conductive layers 180-1 to 180-j (j=8, for example) and the second barrier layer 164. In other words, the second insulation layer 174 may electrically insulate the second conductive layers 180-1 to 180-j (j=8, for example) from each other and it may electrically insulate the second conductive layers 180-1 to 180-j (j=8, for example) from the second barrier layer 164.

The first insulation layer 172 and the second insulation layer 174 may be formed of an insulation material, for example, at least one of $Al_2O_3$, $SiO_2$, $Si_3N_4$, $TiO_2$ and AlN and each of them may be a single layer or multilayer.

Each of the second conductive layers 180-1 to 180-j (j=8, for example) may have a predetermined region that passes through the second insulation layer 172 and is in contact with the first conductive layers 101-2 to 101-n (n=9, for example) corresponding to the second conductive layers 180-1 to 180-j (j=8, for example), respectively.

For example, a portion of each of the second conductive layers 180-1 to 180-j (j=8, for example) may pass through the first insulation layer 172. And each of the second conductive layers 180-1 to 180-j (j=8, for example) may be in contact with the first barrier layer 162 corresponding to each of the second conductive layers 180-1 to 180-j (j=8, for example) via the portion.

Each of the second conductive layers 180-1 to 180-j (j=9, for example) may be disposed corresponding to each of the first conductive layers 101-2 to 101-n (n=9, for example) of the other light emitting cells P2 to Pn (n=9, for example) except the one (for example, P1) of the light emitting cells P1 to Pn (n=9, for example).

A predetermined region of each second conductive layer 180-1 to 180-j (j=8, for example) disposed corresponding to each of the other light emitting cells P2 to Pn (n=9, for example) may be overlapped with a neighboring boundary region (S) along a vertical direction. For example, the second conductive layer 180-1 disposed corresponding to the second light emitting cell P2 may be expanded to be overlapped with the boundary region (S) adjacent to the second light emitting cell P2 along the vertical direction.

At least predetermined region of the second conductive layer (180-1, for example) disposed corresponding to one (P2, for example) of the other light emitting cells P2 to Pn (n=9, for example) may be overlapped with another light emitting cell (P1, for example) adjacent to the one light emitting cell (P2, for example) along the vertical direction. Here, the vertical direction may be from the second conductive layers 180-1 to 180-n (n=9, for example) toward the light emitting cells P1 to Pn (n=9, for example) or an upward direction which is vertical to the second conductive layers 180-1 to 180-j (j=8, for example).

The support layer 195 may be disposed under the second barrier layer 164 and it may support the light emitting structure 110 and provide an electric power to the light emitting structure, together with the first electrode 120. The support layer 195 may be conductive and it may be a metal material such as Cu, Au, Ni, Mo, Cu—W or a semiconductor material including at least one of Si, Ge, GaAs, ZnO, SiC and SiGe.

The bonding layer 190 may be disposed between the second barrier layer 16 and the support layer 195. The bonding layer 190 may be insertedly provided between the second barrier layer 164 and the support layer 195, to bond them to each other. The bonding layer 190 may be formed to bond the support layer 195 in a bonding method. If the support layer 195 is formed in a plating or deposition method or if the support layer 190 is a semiconductor layer, the bonding layer 190 may be omitted. The bonding layer 190 may include at least one of Au, Sn, Ni, Nb, In, Cu, Ag and Pd.

The passivation layer 189 may be disposed on a lateral surface and/or a top surface of each light emitting cell P1 to Pn (n=9, for example). For example, the passivation layer 189 may be disposed on a lateral surface of the first conductive type semiconductor layer 112, a lateral surface of the active layer 114 and a lateral surface of the second conductive type semiconductor layer 116 which are provided in each light emitting cell P1 to Pn (n=9, for example). Also, the passivation layer 189 may be disposed on a top surface of the first conductive type semiconductor layer 112 provided in each light emitting cell P1 to Pn (n=9, for example). The first electrode 120 may be exposed from the passivation layer 189.

The connecting electrodes 122-1 to 122-m (m>1 and 'm' is a natural number) may electrically connect the first electrode 120 disposed on the first conductive type semiconductor layer 112 of one of neighboring two light emitting cells with the second conductive layer disposed corresponding to the conductive layer of the other one of the neighboring two light emitting cells.

For example, a first connecting electrode 122-1 may electrically connect the first electrode 120 of the first light emitting cell P1 with a second conductive layer 180-1 corresponding to the first conductive layer 102-2 of the second light emitting cell P2.

The connecting electrodes 122-1 to 122-m (m>1 and 'm' is a natural number) may be disposed on the passivation layer 189. The connecting electrodes 122-1 to 122-m (m>1 and 'm' is a natural number) may electrically connect the first electrode of one of neighboring two light emitting cells with the second conductive layer (one of 180-1 to 180-j and j=8, for example) of the other one of the two, passing through the protection layer 135 on the boundary region (S) and the first insulation layer 172 located under the boundary region (S).

The light emitting cells P1 to Pn (n=9, for example) may be connected with each other in serial by the connecting electrodes 122-1 to 122-m (m>1 and 'm' is a natural number) and the second conductive layers 180-1 to 180-j.

The first electrode 120 of one of the light emitting cells p1 to Pn (n=9, for example) connected with each other in serial may further include a pad part 121a and 121b. The pad part 121a and 121b may be a region where a wire is bonded to supply a first electric power (a negative electric power (−), for example).

Figure 3:
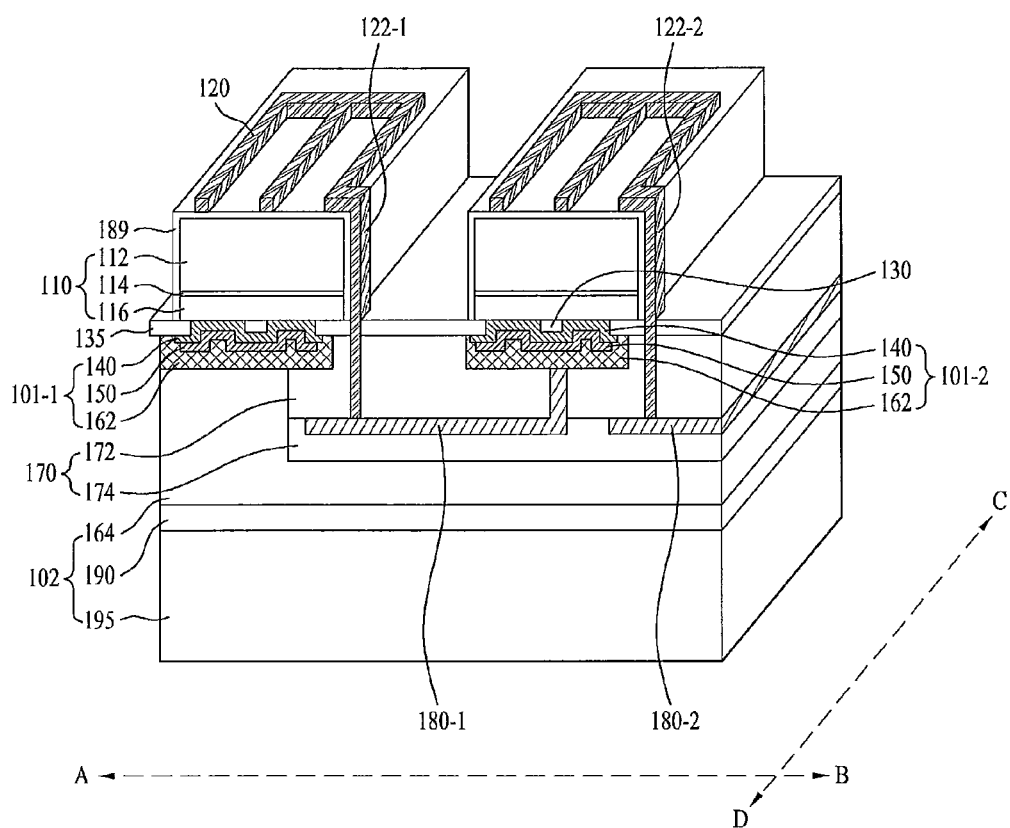
FIG. 3 is a perspective view illustrating the light emitting device shown in FIG. 1, cut away along AB direction and CD direction.
Figure 4:
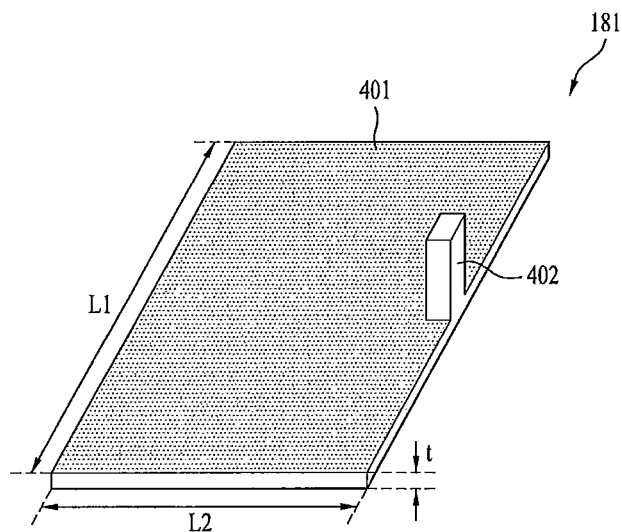
FIG. 4 is illustrating a first embodiment of second conductive layers shown in FIG. 2.

FIG. 3 is a perspective view illustrating the light emitting device 100, cut away along AB direction and CD direction. FIG. 4 illustrates a first embodiment 181 of the second conductive layers 180-1 to 180-j (j≥1) shown in FIG. 2.

In reference to FIGS. 3 and 4, each of the second conductive layers 180-1 to 180-j (j=8, for example) may include a base plate 401 and a through portion 402.

The base plate 401 may be plate-shaped, with a preset area (the vertical length (L1) x the horizontal length (L2)) and the thickness (t). The base plate 401 may be disposed under the first conductive layer 101. The base plate 401 shown in FIG. 4 may be rectangular-shaped and the embodiment is not limited thereto. The base plate 401 may have various shapes such as a circular, oval or polygonal shape.

The base plate 401 may be disposed between the first insulation layer 172 and the second insulation layer 174, corresponding to the other light emitting cells P2 to Pn (n=9, for example) except the first light emitting cell P1. The connecting electrode 122-1 to 122-m (m>1 and 'm' is a natural number) may be connected with a predetermined region of the base plate 401.

At least predetermined region of the base plate 401 disposed corresponding to one (P2, for example) of the other light emitting cells P2 to Pn (n=9, for example) may be overlapped with a neighboring boundary region (S) adjacent thereto and another neighboring light emitting cell (P1, for example) along a vertical direction. For example, at least predetermined region of the base plate 401 disposed corresponding to a second light emitting cell P2 may be overlapped with a neighboring boundary region (S) and a first light emitting cell (P1) along a vertical direction.

At least predetermined region of the base plate 401 disposed corresponding to one (P3, for example) of the other light emitting cells P2 to Pn (n=9, for example) may be overlapped with a neighboring boundary region (S) and another neighboring light emitting cell (P2, for example) along a vertical direction.

The through portion 402 may be connected with a predetermined region of the base plate 401, protruded from the base plate 401. The through portion 402 may be connected with the corresponding first conductive layer, through the first insulation layer 172. For example, the through portion 402 may be connected with the first barrier layer 162, through the first insulation layer 172.

The through portion 402 may be formed of the same material used for the base plate 401 and it may be integrally formed with the base plate 401. The through portion 402 may be protruded, with the horizontal length and the vertical length which are smaller than the horizontal length (L2) and the vertical length (L1) of the second conductive layer 401.

In addition, the through portion 402 may be disposed a predetermined region of a top surface of the base plate 401. The through portion 402 according to the embodiment shown in FIG. 4 may be disposed in contact with a lateral surface of the base plate 401 and the embodiment is not limited thereto. The through portion 402 may be spaced apart a predetermined distance from the lateral surface of the base plate 401.

Figure 5:
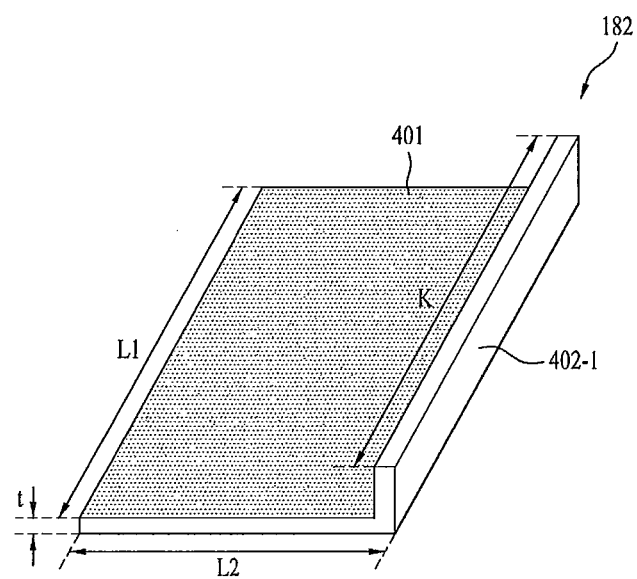
FIG. 5 is illustrating a second embodiment of the second conductive layers shown in FIG. 2.

FIG. 5 illustrates a second embodiment 182 of the second conductive layers 180-1 to 180-j (j≥1). The same numeral references of FIG. 5 as those of FIG. 4 will be given to the same elements and repeated description will be omitted or explained briefly.

In reference to FIG. 5, each of the second conductive layers 180-1 to 180-j (j≥1) may include a base plate 401 and a through portion 402-1. The through portion 402-1 may be a protrusion, with the length of a predetermined side (the vertical length (K), for example) that is the same as the length of a predetermined side of the base plate 401 (the vertical length (L1), for example) (K=L1).

Figure 6:
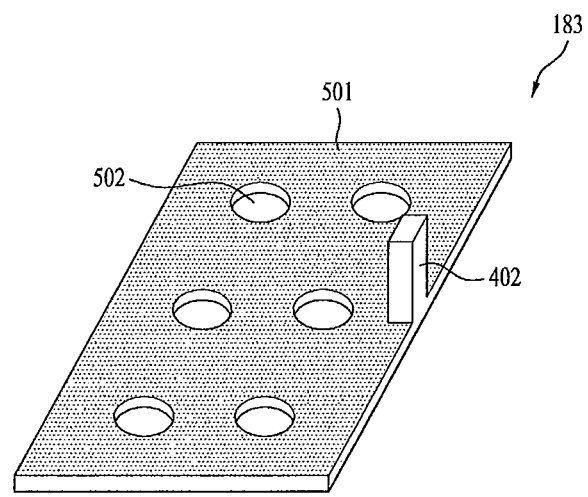
FIG. 6 is illustrating a third embodiment of the second conductive layers shown in FIG. 2.

FIG. 6 illustrates a third embodiment 183 of the second conductive layers 180-1 to 180-j (j≥1) shown in FIG. 2. The same numeral references of FIG. 6 as those of FIG. 4 will be given to the same elements and repeated description will be omitted or explained briefly.

In reference to FIG. 6, each of the second conductive layers 180-1 to 180-j (j≥1) may include a base plate 501 and a through portion 402. The base plate 501 may have at least one through-recess 502. The through portion 402 may be spaced apart a predetermined distance from the at least one through-recess.

The at least one through-recess 502 may be filled with the second insulation layer 174 and the second insulation layer 174 may be in contact with the first insulation layer 172 via the at least one through-recess 502. The at least one through-recess 502 may enhance adhesion between the first insulation layer 172 and the second insulation layer 174.

The through-recess 502 shown in FIG. 6 may be circular, but the embodiment is not limited thereto. The through-recess 502 may have various shapes such as a circular, oval or polygonal shape.

Figure 7:
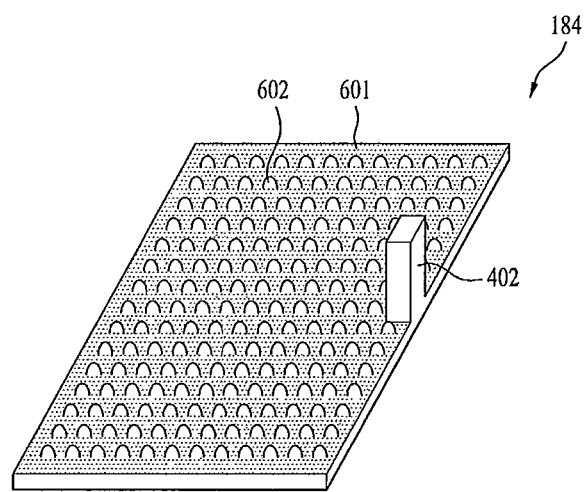
FIG. 7 is illustrating a fourth embodiment of the second conductive layers shown in FIG. 2.

FIG. 7 illustrates a fourth embodiment 184 of the second conductive layers 180-1 to 180-j (j≥1) shown in FIG. 2. The same numeral references of FIG. 7 as those of FIG. 4 will be given to the same elements and repeated description will be omitted or explained briefly.

In reference to FIG. 7, each of the second conductive layers 180-1 to 180-j (j≥1) may include a base plate 601 and a through portion 402. Roughness 602 may be formed on at least one of upper and lower surfaces of the base plate 601. At this time, the roughness 602 may be a regular unevenness or an irregular unevenness. The roughness 602 may enhance adhesion between the second conductive layers 180-1 to 180-n (j≥1) and the first insulation layer 172 and/or adhesion between the second conductive layers 180-1 to 180-j (j≥1) and the second insulation layer 174.

Figure 8:
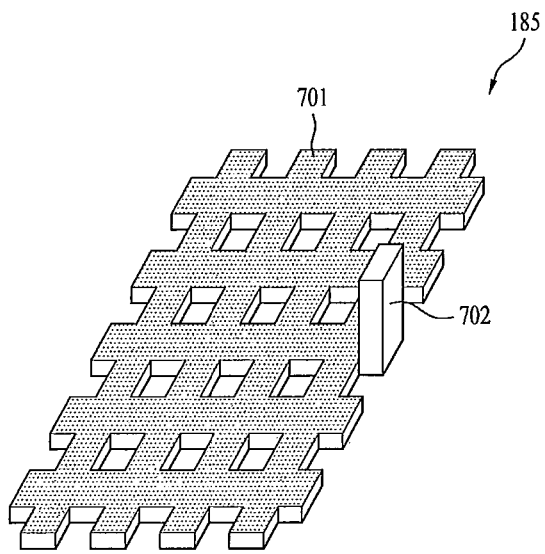
FIG. 8 is illustrating a fourth embodiment of the second conductive layers shown in FIG. 2.

FIG. 8 is illustrates a fifth embodiment 185 of the second conductive layers 180-1 to 180-j (j≥1) shown in FIG. 2. In reference to FIG. 8, each of the second conductive layers 180-1 to 180-j (j≥1) may include a base plate 701 having a meshed structure and a through portion 702. Through portion 702 is connected with a predetermined region of the base plate 701 and is in contact with the first conductive layer (the first barrier layer 162, for example) through the first insulation layer 172. Adhesion between the first insulation layer 172 and the second insulation layer 174 may be enhanced by the base plate 701 having the meshed structure according to this embodiment.

In case an electric power having a high driving voltage is applied to the light emitting structure including the plurality of the light emitting cells connected with each other in serial, the largest electric field may be concentrated on some of the light emitting cells having the electric power directly applied thereto and some of the light emitting cells adjacent to them and breakage of the light emitting cells having the electric field concentrated thereon may occur.

According to the embodiment, a second electric power (a positive electric power (+), for example) may be supplied to the light emitting structure 110 via the second metal layer 102, the second barrier layer 164 and the first conductive layer 101-1. A first electric power (a negative electric power (−), for example) may be supplied to the light emitting structure 110 via the first electrode 120 of a ninth light emitting cell P9 and the pad part 121$a$ and 121$b$. The light emitting cells P1 to Pn (n=9, for example) may be connected with each other in serial by the connecting electrodes 122-1 to 122-$m$ (m=8, for example) and the second conductive layers 180-1 to 180-$j$ (j=8, for example).

In case a high driving voltage is applied to the light emitting structure 110, the electric field concentrated on the first light emitting cell P1 and the second light emitting cell P2 may be dispersed by the second conductive layers 180-1 to 180-$j$ (j≥1) connecting the light emitting cells P1 to Pn (n=9, for example) according to the embodiment. As a result, breakage of the light emitting device 100 may be prevented. In other words, the second conductive layers 180-1 to 180-$j$ (j≥1) may lengthen a transmission path of currents and they may be employed to prevent breakage of the light emitting cells P1 to Pn (n=9, for example) which might be generated by the high driving voltage.

Figure 9:
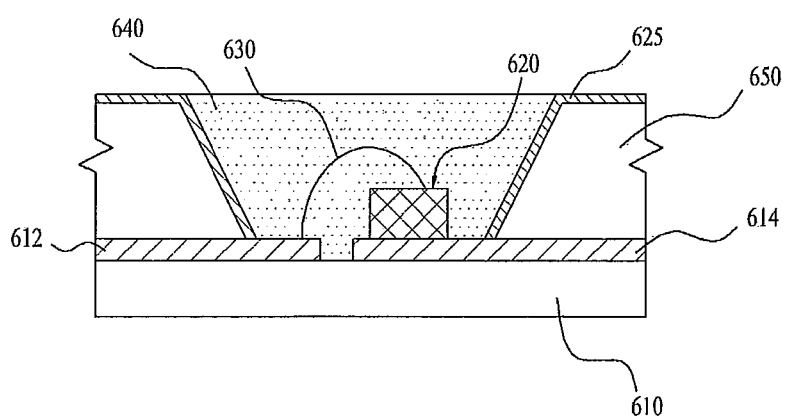
FIG. 9 illustrating a light emitting device package including the light emitting device according to the embodiment.

FIG. 9 illustrates a light emitting device package including the light emitting device according to the embodiment.

In reference to FIG. 9, the light emitting device package according to this embodiment may include a package body 610, a first lead frame 612, a second lead frame 614, a light emitting device 620, a reflecting plate 625, a wire 630 and a sealing layer 640.

The package body 610 may have a cavity formed in a predetermined region thereof. At this time, a lateral wall of the cavity may be inclined. The package body 610 may be a substrate having good insulation or thermal conductivity such as a silicon-based wafer level package, a silicon substrate, a silicon carbide (SiC) or aluminum nitride (A1N), or it may have a structure having a plurality of multi-layered substrates. This embodiment may not be limited to the material, structure and shape of the package body mentioned above.

Considering heat sink or mounting of the light emitting device, the first lead frame 612 and the second lead frame 614 may be disposed on a surface of the package body 610, electrically separable from each other. The light emitting device 620 may be electrically connected with the first lead frame 612 and the second lead frame 614. At this time, the light emitting device 620 may be the light emitting device 100 according to the embodiment described above.

For example, the second metal layer 102 of the light emitting device 100 shown in FIG. 2 may be electrically connected with the second lead frame 614 and the pad part 121$a$ and 121$b$ of the ninth light emitting cell P9 may be bonded to the first lead frame 612 by the wire 630.

The reflecting plate 625 may be formed on a lateral wall of the cavity formed in the package body 610 to make the light emitted from the light emitting device 620 directed toward a preset direction. The reflection plate 625 may be formed of a light reflective material, for example, metal coating or a metal piece.

The sealing layer 640 may surround the light emitting device 620 located in the cavity of the package body 610, to protect it from the external environment. The sealing layer 640 may be formed of a colorless transparent polymer resin material such as epoxy or silicon. The sealing layer 640 may include phosphor to change the wavelength of the light emitted from the light emitting device 620. At least one of the light emitting devices according to the embodiments described above the light emitting device package may be mounted on the light emitting device package and this embodiment may not be limited thereto.

The light emitting device package according to the present invention may be arrayed on a substrate. As optical members, a light guide plate, a prism sheet and a diffusion sheet may be disposed on a luminous path of the light emitting device packages. Those light emitting device packages, the substrate and the optical members may be functioned as a light unit.

A further embodiment may be realized by a display device, a pointing device or a lighting system including the semiconductor light emitting device or the light emitting device package according to the embodiments. For example, the lighting system may include a lamp and a streetlamp.

Figure 10:
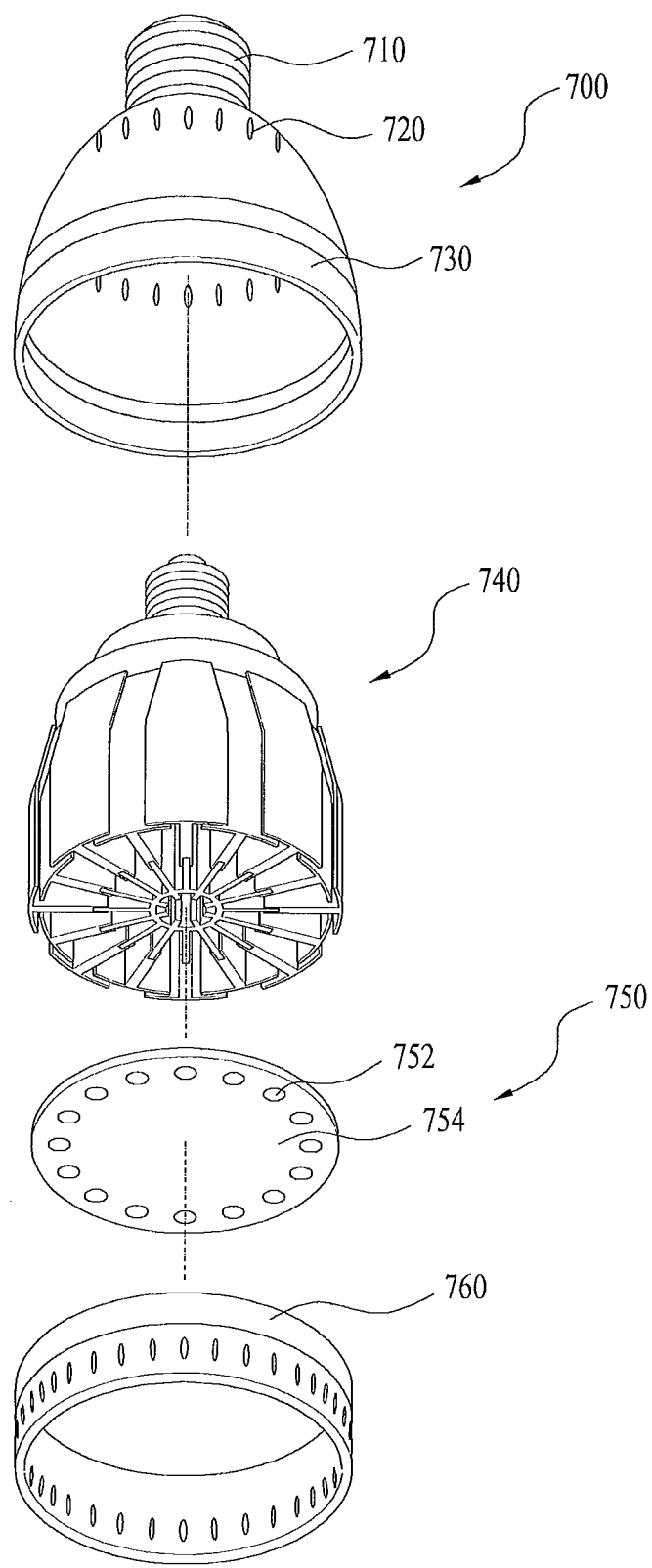
FIG. 10 is an exploded perspective view illustrating a lighting device including the light emitting device package according to the embodiment.

FIG. 10 is an exploded perspective view illustrating a lighting device according to an embodiment that includes the light emitting device package according to the embodiments. In reference to FIG. 10, the lighting device according to this embodiment may include a light source 750 to emit light, a housing 700 to mount the light source 750 therein, a heat sink 740 to emit the heat of the light source 750, and a holder 760 to couple the light source 750 and the heat sink part 740 to the housing 700.

The housing 700 may include a socket coupling part 710 coupled to an electric socket (not shown) and a housing body part 730 connected to the socket coupling part 710 to mount the light source 750 therein. A single air-hole 720 may be formed through the housing body part 730.

A plurality of air holes 720 may be provided in the housing body part 730 of the housing 700. A single air hole may be provided or a plurality of air holes may be disposed along a radial direction. Rather than the radial arrangement, other various arrangements of the air holes may be possible.

The light source 750 may include a plurality of the light emitting modules 752 disposed on a circuit board 754. The circuit board 754 may be formed in a shape that is able to be inserted in an opening of the housing 700 and it may be formed of a material having a high thermal conductivity to transmit heat to the heat sink 740 which will be described in detail later.

The holder 760 may be provided under the light source and the holder 760 may include a frame and another air hole. Although not shown in the drawing, under the light source 750 may be provided optical members to diffuse, scatter or collect the light emitted from the light emitting device package 752 of the light source 750.

Figure 11:
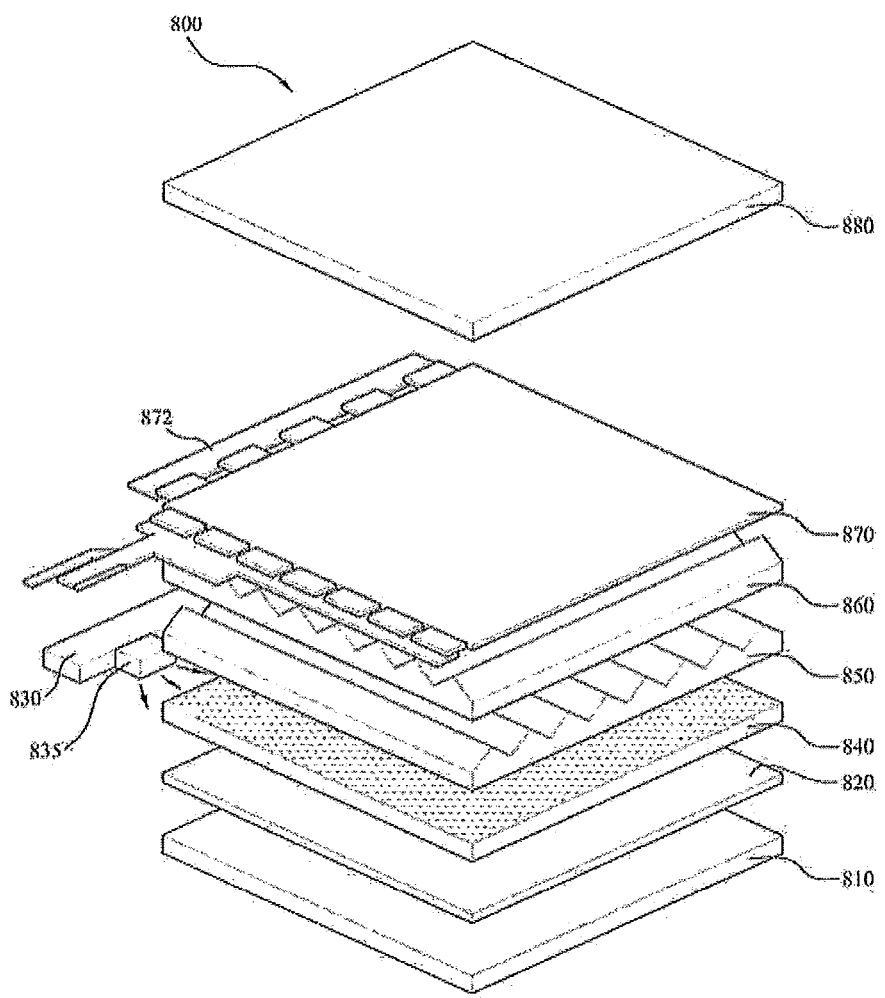
FIG. 11 is illustrating a display device including the light emitting device package.

FIG. 11 illustrates a display device according to an embodiment, which includes the light emitting device package according to the embodiment.

In reference to FIG. 11, the display device 800 according the embodiment may include a bottom cover 810, a reflecting plate 820 disposed on the bottom cover 810, a light source module 830 and 835 configured to emit light, a light guide plate 840 disposed in front of the reflection plate 820 to guide the light emitting from the light source module 830 and 835 toward a front of the display device, an optical sheet including prism sheets 850 and 860 disposed in front of the light guide plate 840, a display panel disposed in from the optical sheet, an image signal output circuit 872 connected to the display panel 870 to supply an image signal to the display panel 870, and a color filter 880 disposed in front of the display panel 870. Here, the bottom cover 810, the reflection plate 820, the light source module 830 and 835, the light guide plate 840 and the optical sheet may compose a backlight unit.

The light source module may include a substrate 830 and a light emitting device package 835 mounted on the substrate 830. Here, a PCB may be used as the circuit board 835.

The bottom cover 810 may accommodate elements provided in the image display device 800. The reflecting plate 820 may be provided as a separate element as shown in the drawing or it may be provided by coating a rear surface of the light guide panel 840 or a front surface of the bottom cover 810 with a material having a high reflectivity.

Here, the reflecting plate 820 may be formed of a material having a high reflectivity that is useable in an ultra-thin type such as polyethylene terephthalate (PET).

The light guide panel 840 may formed of a material having a high index of refraction and a high transmissivity such as polymethylemethacrylate (PMMA), polycarbonate (PC) or polyethylene (PE).

The first prism sheet 850 may be formed of a light transmissive polymer with translucency and elasticity and it may be provided on a surface of a support film. The polymer may have a prism layer having a plurality of three-dimensional structures formed thereon repeatedly. Here, the plurality of the patterns may be formed in a strip type having crests and troughs repeated therein.

The direction of crests and troughs formed on a surface of a support film of the second prism sheet 860 may be vertical to the direction of the crests and troughs formed in a surface of the support film of the first prism sheet 850. This may serve to uniformly distribute the light transmitted from the light source module and the reflective plate 820 in all directions of the panel 870.

Although not shown in the drawing, a diffusion sheet may be disposed between the light guide plate 840 and the first prism sheet 850. The diffusion sheet may be formed of a polyester-and-polycarbonate-based material and a light projection angle may be widened by refraction and scattering of the light incident from the backlight unit. The diffusion sheet may include a supporting layer having a light diffusing agent and first and second layers formed on a light emitting surface (toward the first prism sheet) and light incident surface (toward the reflecting sheet), with no light diffusing agent.

According to the embodiment, the diffusion sheet, the first prism sheet 850 and the second prism sheet 860 may compose an optical sheet. The optical sheet may be configured of another combination, for example, of a combination of micro-lens arrays or a combination of a single prism sheet and a micro-lens array. The display panel 870 may be a liquid crystal display.

A liquid crystal display may be disposed on the display panel 870. Rather than the liquid crystal display panel 860, another type of display device requiring the light source may be provided.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting structure divided into a plurality of light emitting cells and a boundary region, the plurality of the light emitting cells comprising a first conductive type semiconductor layer, an active layer and a second conductive type semiconductor layer, respectively;
    a first electrode disposed on each of the light emitting cells;
    first conductive layers disposed under the light emitting cells;
    at least one second conductive layer disposed under the first conductive layers and spaced apart from the first conductive layers;
    a first insulation layer disposed between each of the first conductive layers, and between the first conductive layers and the at least one second conductive layer; and
    a connecting electrode connecting the first electrode on one light emitting cell with the at least one second conductive layer under another light emitting cell,
    wherein the at least one second conductive layer is connected with one of the first conductive layers passing through the first insulation layer.

2. The light emitting device according to claim 1, wherein the at least one second conductive layer is disposed corresponding to the other ones except one of the light emitting cells and is spaced apart a predetermined distance from each other.

3. The light emitting device according to claim 1, wherein each of the first conductive layers comprises:
    a reflection layer disposed under each of the light emitting cells; and
    a first barrier layer disposed under the reflection layer.

4. The light emitting device according to claim 3, further comprising:
    a second barrier layer disposed under the second conductive layers, and being electrically connected with one of the first conductive layers; and
    a second insulation layer disposed between each of the second conductive layers, and between the second barrier layer and the second conductive layers.

5. The light emitting device according to claim 1, wherein the connecting electrode connects a first electrode of two neighboring light emitting cells with a second conductive layer corresponding to the other one of the two neighboring light emitting cells.

6. The light emitting device according to claim 5, further comprising:
    a passivation layer disposed between each of the light emitting cells and the connecting electrode; and
    a protection layer disposed on the boundary region.

7. The light emitting device according to claim 6, wherein the connecting electrode is disposed on the passivation layer, passing through the protection layer and the first insulation layer.

8. The light emitting device according to claim 1, wherein the first conductive layers are disposed corresponding to the light emitting cells, respectively, and
    one of the first conductive layers is electrically connected with a corresponding one of the light emitting cells.

9. The light emitting device according to claim 1, wherein a predetermined region of the second conductive layer is overlapped with a neighboring region of the boundary region adjacent thereto along a vertical direction.

10. The light emitting device according to claim 9, wherein at least a predetermined region of the second conductive layer disposed corresponding to one of the other light emitting cells is overlapped with another light emitting cell adjacent to the one of the other light emitting cells along a vertical direction.

11. The light emitting device according to claim 1, wherein each of the second conductive layers comprises:
    a base plate formed in a plate shape, with the connecting electrode connected thereto; and
    a through portion protruded from the base plate, and being connected with the corresponding first conductive layer through the first insulation layer.

12. The light emitting device according to claim 11, wherein the through portion is formed of the same material as the material used for the base plate.

13. The light emitting device according to claim 11, wherein the length possessed by a side of the through portion is the same as the length possessed by a side of the base plate.

14. The light emitting device according to claim 11, wherein the base plate comprises at least one through-recess.

15. The light emitting device according to claims 11, wherein roughness is formed in at least one of top and lower surfaces of the base plate.

16. The light emitting device according to claim 1, wherein the second conductive layers are formed of a reflective material.

17. The light emitting device according to claim 4, wherein each of the second conductive layers comprises:
    a base plate formed in a plate shape, with the connecting electrode connected thereto; and
    a through portion protruded from the base plate, and being connected to a first barrier layer of the corresponding first conductive layer, through the first insulation layer.

18. The light emitting device according to claim 4, further comprising:
    a support layer disposed under the second barrier layer.

19. A light emitting device package comprising:
    a package body;
    first and second lead frames disposed on the package body, and being electrically independent from each other; and
    the light emitting device according to claim 1 which is electrically connected with the first lead frame and the second lead frame.

20. A lighting device comprising:
    a light source configured to project light;
    a housing having the light source mounted therein;
    a heat sink emitting a heat of the light source;
    a holder configured to couple the light source and the heat sink to the housing,
    wherein the light source comprises:
        a substrate; and
        the light emitting device according to claim 1 which is disposed on the substrate.

* * * * *